United States Patent
Allred, Jr. et al.

(10) Patent No.: US 7,348,570 B2
(45) Date of Patent: Mar. 25, 2008

(54) UNSUPPORTED, ELECTRON TRANSPARENT FILMS AND RELATED METHODS

(75) Inventors: Daniel B Allred, Jr., Seattle, WA (US); Daniel T Schwartz, Seattle, WA (US)

(73) Assignee: University of Washington, Seattle, WA (US)

( * ) Notice: Subject to any disclaimer, the term of this patent is extended or adjusted under 35 U.S.C. 154(b) by 260 days.

(21) Appl. No.: 11/304,305

(22) Filed: Dec. 14, 2005

(65) Prior Publication Data

US 2007/0131873 A1 Jun. 14, 2007

(51) Int. Cl.
*H01J 37/20* (2006.01)
*B32B 3/10* (2006.01)

(52) U.S. Cl. .................... 250/440.11; 428/138

(58) Field of Classification Search ............... None
See application file for complete search history.

(56) References Cited

U.S. PATENT DOCUMENTS 4,139,668 A * 2/1979 Ward, III ............... 428/138
4,967,825 A 11/1990 Brown, Jr. et al.
5,546,811 A * 8/1996 Rogers et al. ........... 73/800
5,821,544 A * 10/1998 Augustus et al. ....... 250/440.11
7,112,790 B1 * 9/2006 Wang ..................... 250/307

OTHER PUBLICATIONS

Dijkstra, J.M., et al., "Quantitative EPMA and TEM of Unsupported Films," *Mikrochimica Acta* 114(115):277-284, 1994.
Hunter, W.R., et al., "Thin Films and Their Uses for the Extreme Ultraviolet," *Applied Optics* 4(8):891-898, Aug. 1965.
Kuehner, A.L., "New Tough Films and Bubbles," *Journal of Chemical Education* 25:211-212, 1948.
Kumar, S., et al., "Preparation of Unsupported Metal Organic and Ceramic Thin Film Specimens for TEM Observation," *Journal of the American Ceramic Society* 76(7):1882-1884, 1993.
Niedrig, R., and O. Bostanjoglo, "Imaging and Modeling of Pulse Laser Induced Evaporation of Metal Films," *Journal of Applied Physics* 81(1):480-485, Jan. 1997.
Smith, E., and J. Nutting, "Direct Carbon Replicas From Metal Surfaces," *British Journal of Applied Physics* 7:214-217, Jun. 1956.

* cited by examiner

*Primary Examiner*—Jack I. Berman
(74) *Attorney, Agent, or Firm*—Christensen O'Commor Johnson Kindness PLLC (57) ABSTRACT

Unsupported, electron transparent film useful in supporting a sample for imaging and analysis by transmission electron microscopy; methods for making and using the unsupported, electron transparent film; and an integrally formed combination of an unsupported, electron transparent film and substrate.

37 Claims, 7 Drawing Sheets

UNSUPPORTED, ELECTRON TRANSPARENT FILMS AND RELATED METHODS

STATEMENT OF GOVERNMENT LICENSE RIGHTS

This invention was made with government support under grant DAAD19-01-0499 awarded by the United States Army Research Office. The government has certain rights in the invention.

FIELD OF THE INVENTION

The present invention relates to unsupported, electron transparent films and methods for making and using unsupported, electron transparent films.

BACKGROUND OF THE INVENTION

Metal surfaces are known for their very high surface energies and interesting chemistry. In modem integrated circuit microfabrication technology, thin metal films are deposited as seed layers for adhesion and electrical continuity for electroplating processes. In various surface science and microbiology applications, noble metals are useful as completely inert background surfaces that can be chemically coupled with alkanethiol-derived molecules. In the various forms of oxides, sulfides, and selenides, metals make interesting compound semiconductors that are the subject of intense study. Many metal oxides are useful to support custom-designed catalyst materials (also typically made of metals and their oxidized counterparts) in high temperature reactors. Clearly, metal surfaces are useful for an incredibly large number of technological reasons.

Transmission electron microscopy (TEM) is an highly useful and versatile technique that allows visualization and characterization of extremely small objects, such as individual molecules and atoms. Because the image is formed by the transmission of electrons through the sample, any object that is directly behind or in front of the sample to be studied will be incorporated into the final image or analysis. In transmission electron microscopy there is no "microscope slide" analog because all known solid materials interact with the electrons emitted by the electron microscope. No ordinary surface of any practical thickness is transparent enough to electrons to allow immediate viewing in the microscope. Thus, the sample must be specially prepared for TEM. Sample preparation procedures vary dramatically from sample to sample, and virtually all are time-consuming and destructive, typically requiring significant time to acquire the requisite skill.

The ideal solution would be to have customized surfaces that are thin enough to be placed immediately in the transmission electron microscope without the need for sample preparation. However, such a surface must still be easy to handle physically, robust enough for a wide variety of applications, provide the needed electron transparency, and yet be mechanically stable under the intense electron beam and associated radiation. Commercially available surfaces are derived from two basic elements: carbon and silicon. Carbon-based films are either polymer or pure carbon films, silicon-based films are based on silica ($SiO_x$) or silicon nitride. These two elements represent the current diversity available, but clearly the most useful materials, metals, are needed to allow more sophisticated samples to be produced on the full spectrum of material surfaces which can benefit from the tremendous characterization power of the transmission electron microscope.

The conventional technique for making electron transparent metallic films involves depositing of a metal film onto a sacrificial surface, dissolving the sacrificial surface to release the metallic film, and then picking up the released metal film onto a blank TEM specimen grid. Although the conventional technique for making metallic films for TEM has been around for some time, the procedure requires careful and tedious attention, making the procedure a highly labor-intensive process available in studies where only a limited number of surfaces are necessary for study. Another standard technique involves depositing the metal onto nitrided silicon, then back-etching to the nitride. This process generally requires films too thick for good electron transparency and suffers from poor yields.

There exists a need for a method for making unsupported, electron transparent films that enables high throughput, hands-free preparation so as to render such unsupported, electron transparent films commercially viable products to relieve end users of the need to make them on their own. The present invention seeks to fulfill this need and provides further related advantages.

SUMMARY OF THE INVENTION

In one aspect of the invention, an unsupported, electron transparent film is provided. The film is useful in supporting a sample for imaging and analysis by transmission electron microscopy.

In another aspect, the invention provides an integrally formed combination of an unsupported film and a substrate, comprising an unsupported film substantially completely overlaying a surface of the substrate having a plurality of apertures. In one embodiment, the substrate having a plurality of apertures is a specimen grid for transmission electron microscopy.

In a further aspect, the invention provides methods for making the unsupported, electron transparent film. In the methods, a solid film is formed onto a substrate having a plurality of apertures; a film is formed onto the solid film; and then the solid film is substantially completely dissolved to provide the substrate bearing an unsupported film. In one embodiment, the substrate having a plurality of apertures is a specimen grid for transmission electron microscopy.

In other aspects of the invention, methods for using the unsupported, electron transparent film for imaging and analysis by transmission electron microscopy are provided.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In one aspect, the invention provides unsupported, electron transparent films. The films are ultrathin, electron transparent, stable under an electron beam, and useful in electron microscopy and spectroscopy. In certain embodiments, the films of the invention are metal films. The metal films of the invention are alternatives to commercially available carbon-and silicon-based films.

In certain embodiments, the films of the invention are made of one of a variety of metals, metal alloys, metal oxides, and combinations thereof. Suitable metals, alloys, and oxides include gold, silver, copper, nickel, titanium, palladium, platinum, iridium, rhenium, ruthenium, osmium, or rhodium, their alloys and oxides. In one embodiment, the metal film is made from one or more noble metals. Such a film may be useful in surface science applications. In one embodiment, the metal film is made from one or more semiconductor materials such as gallium arsenide. In one embodiment, the metal film is made from one or more perovskite materials. Such a film may be useful in catalyst applications. In one embodiment, the metal film is made from one or more biocompatible materials such as titanium and aluminum oxide. Such a film may be useful in biological applications.

In other embodiments, the films of the invention are made from carbon, silica, or alumina.

The films of the invention have thicknesses in the range of from about 1 nm to about 3 nm. In one embodiment, the film has a thickness in the range of about 2 nm.

The term "unsupported film" refers to a film that is formed by depositing a material on a sacrificial support layer that is subsequently substantially completely removed by dissolution leaving the film unsupported.

The term "unsupported metal film" refers to a metal film that is formed by depositing metal on a sacrificial support layer that is subsequently substantially completely removed by dissolution leaving the metal film unsupported.

In one embodiment, the invention provides a combination of an unsupported film overlaying a substrate having a plurality of apertures. The combination of the unsupported film and substrate is integrally formed. As used herein, the term "integrally formed" refers to a film/substrate combination in which the combination is made by forming the film on the substrate through the use of an intermediate sacrificial support layer. The substrate includes a plurality of apertures, each aperture having a size sufficiently great that a film spanning each aperture cannot be fabricated directly onto the substrate. Through the use of a sacrificial support layer, which can span relatively large apertures (e.g., microns to inches) by taking advantage of liquid phase surface tension forces, unsupported films can be formed on a variety of substrates having a wide range of aperture sizes. As described below, an unsupported metal film is fabricated by depositing metal onto a sacrificial support layer covering a surface of the substrate. The sacrificial support layer covers a major surface of the substrate and spans the substrate's apertures providing a surface for receiving metal. Once the metal has been deposited and the metal film formed, the sacrificial support layer is substantially removed by dissolving with an appropriate solvent or solvents to provide an unsupported metal film integrally formed with an underlying substrate.

By this method, the metal film substantially covers a major surface of the substrate, thereby spanning the substrate's plurality of apertures. Thus, in one embodiment, the invention provides an integrally formed, metal film-coated substrate, comprising an unsupported metal film substantially completely overlaying a substrate having a plurality of apertures. In one embodiment of the integrally formed, metal film-coated substrates, the perimeters of the metal film and the substrate are substantially the same (i.e., the metal film substantially completely overlays a major surface of the substrate).

In one embodiment, the substrate having a plurality of apertures is a specimen grid for transmission electron microscopy. Thus, in one embodiment, the invention provides an integrally formed, metal film-coated specimen grid suitable for use in transmission electron microscopy. The integrally formed, metal film-coated specimen grid includes an unsupported metal film substantially completely overlaying a specimen grid for transmission electron microscopy.

In another aspect, the invention provides methods for making unsupported, electron transparent metal films. In the methods, a metal film is fabricated onto a surface coated with a solid film, and then the solid film dissolved with an appropriate solvent or solvents, thereby releasing the metal film. In one embodiment, the surface is a substrate having a plurality of apertures (e.g., a specimen grid for transmission electron microscopy). In this embodiment, the solid film provides a sacrificial surface on which the metal film can be fabricated. Fabrication of metal films on substrates having apertures cannot be carried out without the use of an overlying layer (e.g. sacrificial support layer) due to the inability of fabricating a film that can span the substrate's apertures.

The solid film can be made from an amorphous solid or a crystalline solid.

As used herein, the term "amorphous solid" refers to a non-crystalline solid. The solid film is a sacrificial support layer that serves to receive the components of and support the metal film during and after its fabrication. Once the metal film has been formed on the solid film, the solid film is dissolved (i.e., sacrificed), thereby providing the unsupported metal film.

In one embodiment, the solid film (or sacrificial support layer) is formed on the surface of substrate having a plurality of apertures (e.g., a transmission electron microscope specimen grid). Suitable solid films can be made from readily available and inexpensive materials that can be easily applied to or deposited on one or more substrates. The solid film that is formed on the substrate's surface are made by applying a solution or suspension of the solid in an appropriate solvent (or solvents) to the surface using rapid and/or automated techniques, such as dipping, spraying, painting, or pipetting. Evaporation or removal of the solvent(s) results in a solid film (i.e., sacrificial support layer). As noted above, the solid film formed on the substrate provides a sacrificial layer that spans the substrate's apertures and receives the components of and supports the metal film.

The sacrificial support layer is a solid film that is stable under vacuum and temperature conditions required for fabricating the metal film. In one embodiment, the solid film is organic and can be substantially removed with an organic solvent.

Representative solid films can be made from liquid inks (e.g., SHARPIE line of permanent marker inks from the Sanford Corporation, Bellwood, Ill. which can be extracted from individual pens or purchased in 55-gallon drums). In one embodiment, the solid film (i.e., sacrificial support layer) is the residue from a permanent ink and the solvent for dissolving that film is methanol.

Other suitable solids useful in the invention include the solid layer obtained from sugar aerosol/water systems. Useful sugar aerosol/water systems are described in Carpenter, F. E., Curcio, J. A., *Rev. Sci. Instrum.* 21:675, 1950 and Kuehner, A. L., *J. Chem. Ed.* 25:211-212, 1948, each incorporated herein by reference in its entirety. A representative sugar aerosol solution is made by dissolving a surfactant in water (e.g., 2 grams dioctyl sodium sulfosuccinate in 98 grams water) followed by the addition of a sugar (e.g., 48 grams sucrose). Sugar solid films can be dissolved by water.

In another embodiment, the solid film can be made from varnish (e.g., fingernail polish) and dissolved by acetone.

The sacrificial support layer has an associated solvent that is effective in dissolving the layer to an extent sufficient to provide an unsupported metal film that is useful for its intended purpose (e.g., TEM sample support). The solvent for dissolving the sacrificial support layer preferably readily dissolves the solid film residing between the metal film and the substrate surface on which the solid film was formed. In one embodiment, the solvent substantially completely dissolves the solid film. Suitable solvents include acetone, methanol, and ethanol, among others.

Once the sacrificial support layer has been formed on the surface of the substrate, the metal film can be formed. The metal film can be fabricated on the solid film in any one of a variety of ways. In one embodiment, the metal film is fabricated using an argon ion sputtering device. The device has a compact design and metal targets for preparing different metal films coatings can be readily switched. Ideally, the metal film produces no background structure (i.e., no diffraction contrast in the image) in transmission electron microscopy applications. In practice, virtually all metal films produce some form of grain texture that will be superimposed on the image.

Figure 1:
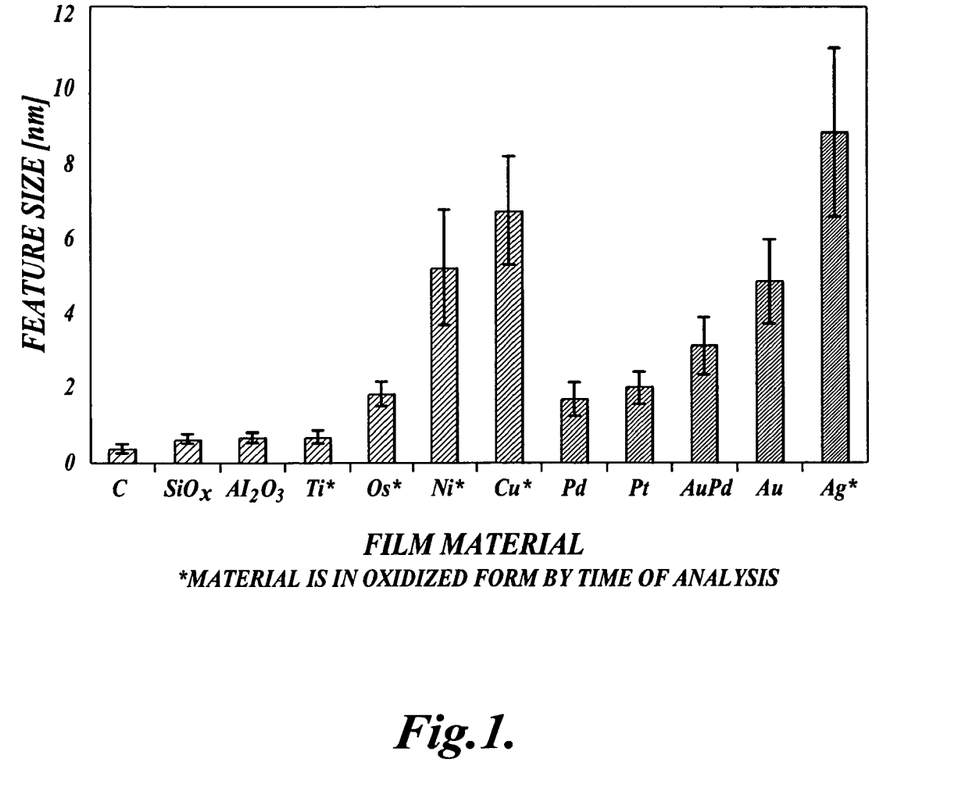
FIG. 1 is a bar graph comparing feature size for representative films of the invention.
Figure 2A:
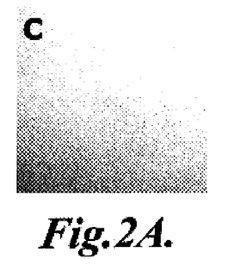
FIGS. 2A-2L are TEM images of carbon, silica, alumina, titanium, osmium, nickel, copper, palladium, silver, platinum, gold-palladium alloy, and gold films of the invention, respectively.
Figure 2B:
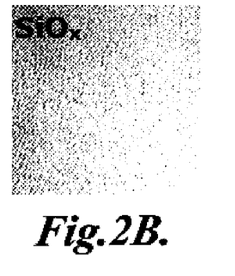
Figure 2C:
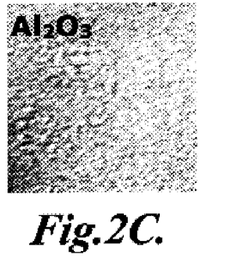
Figure 2D:
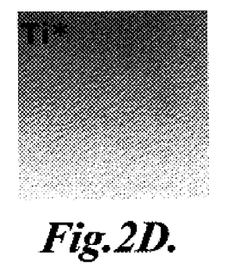
Figure 2E:
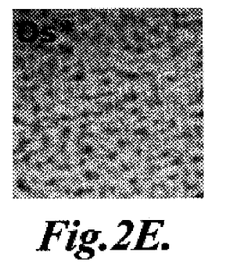
Figure 2F:
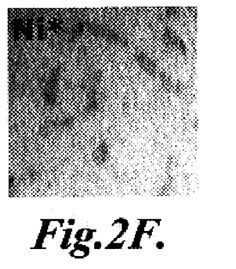
Figure 2G:
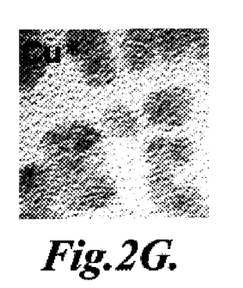
Figure 2H:
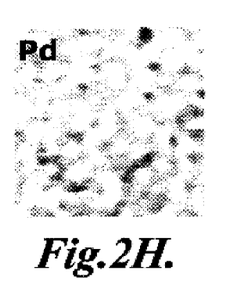
Figure 2I:
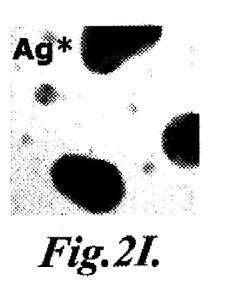
Figure 2J:
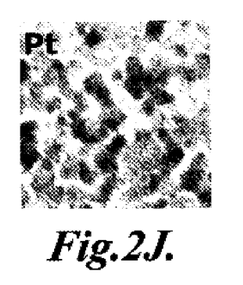
Figure 2K:
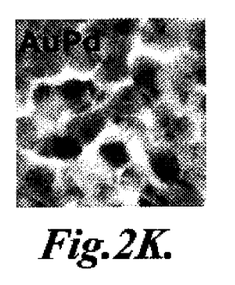
Figure 2L:
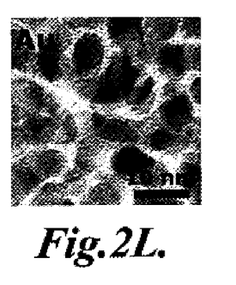

A summary of the background structure of representative films of the invention are shown in FIG. 1. Each film was prepared with no modification of the procedure as outlined in this invention with the exception of carbon, silica, and alumina, in that their thicknesses were made to be 10 nm instead of the 2 nm as the preferred mode for metals. Background structure obscures high resolution details of samples and thus one would naturally select a film with the least background structure to work with. However, carbon films are not universally useful. Thus, the metal films of the invention (e.g., osmium, palladium, platinum, nickel, gold/palladium, silver, and gold) are useful depending on the desired properties of the film and imaging requirements. Note that, because this demonstration was performed without any alteration of coating conditions, there may be opportunity to improve the grain structure of some materials by optimizing coating parameters. The emphasis here is illustrate the broad versatility of this invention where traditional products can be made using the same techniques as those for novelty products with insignificant process or hardware modifications.

It will be appreciated that the grain size distributions illustrated in FIG. 1 are exemplary only and that, for a given film, grain size can be manipulated and optimized by, for example, variation of the sputtering conditions.

Select TEM images of representative films of the invention in order of increasing background structure are illustrated in FIGS. 2A-2L. FIGS. 2A-2L are images of representative carbon, silica, alumina, titanium, osmium, nickel, copper, palladium, silver, platinum, gold-palladium alloy, silver-palladium alloy, and gold films of the invention, respectively. Visible grains in the films can be eliminated by a chemical treatment step described below.

Figure 3A:
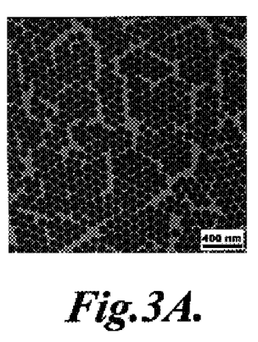
FIGS. 3A-3H are TEM images of select samples obtained using representative metal films of the invention.
Figure 3B:
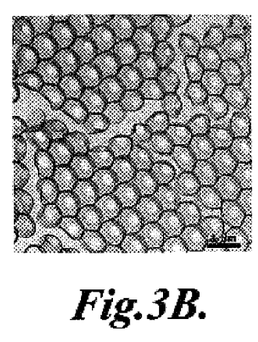
Figure 3C:
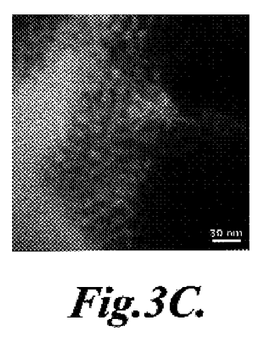
Figure 3D:
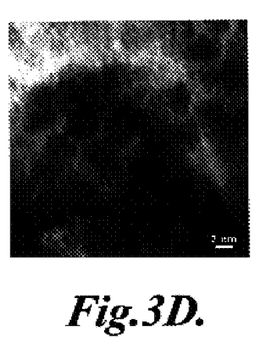
Figure 3E:
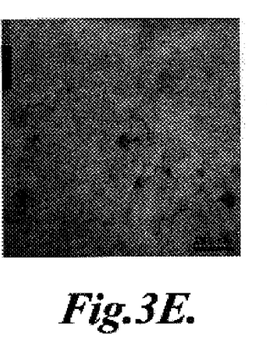
Figure 3F:
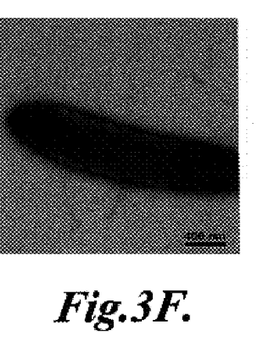
Figure 3G:
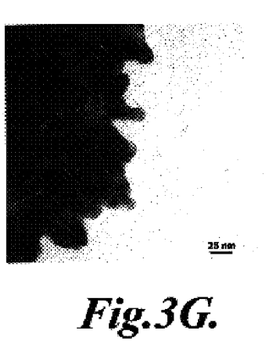
Figure 3H:
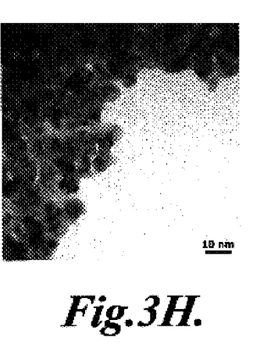

TEM images of various subjects using representative metal films of the invention are illustrated in FIGS. 3A-3H. FIG. 3A is an image of 100 nm latex spheres on a gold-palladium alloy (60-40) film. FIG. 3B is an image of polypyrrole cups on a gold-palladium alloy (60-40) film. FIG. 3C is an image of nanoporous cuprite electrodeposited on an osmium film. FIG. 3D is a high resolution image cuprite nanoparticle on a gold-palladium alloy (60-40) film. FIG. 3E is an image of a DNA/protein complex on a copper film. FIG. 3F is an *E. coli* cell on a copper film. FIG. 3G is an image of electrodeposited gold a platinum film. FIG. 3G is an image of electrodeposited gold on a gold-palladium alloy (60-40) film.

All images were taken using a Philips 420 TEM at 120 kV accelerating voltage, except for FIG. 3E which was taken at 40 kV and performed under very low dose and at underfocus. The instrument has an estimated spherical aberration coefficient of 1.3 mm and a maximum point-to-point resolution of 0.35 nm.

In one embodiment, the metal film is fabricated by sputtering. Sputtering systems commercially available from SPI Supplies, Westchester, Pa. and Gatan Inc., Pleasanton, Calif., with no modification from the manufacturer's recommended coating conditions were used to produce metal films. Films can be fabricated from a variety of metals including, for example, gold, platinum, palladium, silver (oxide), nickel (oxide), copper (oxide), and osmium (oxide). Typical film thicknesses were determined to be about 2 nm on average. Topography imaging of representative films using an atomic force microscope on metal-coated TEM grids (directly over bare film regions) revealed topography variations of +/− 1-2 nm. Thus, the films are presumed to contain nanometer-sized crystals of the metal bound between extremely thin (a few atoms) boundaries of poorly ordered material.

Figure 4A:
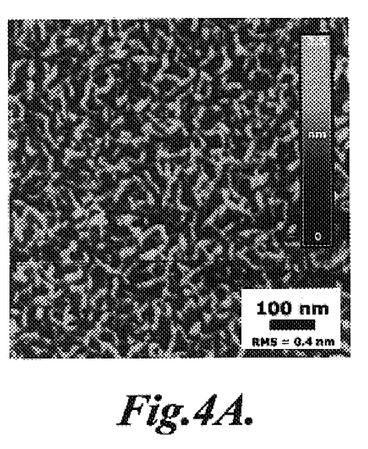
FIGS. 4A and 4B are atomic force microscopy (AFM) and transmission electron microscopy (TEM) images of a representative metal film of the invention.
Figure 4B:
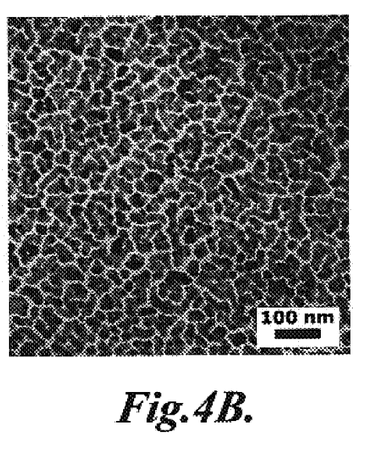

Images of a representative film of the invention are illustrated in FIGS. 4A and 4B. FIG. 4A illustrates an atomic force microscope (AFM) image. Referring to FIG. 4A, the AFM results show roughness variations of about 4 Å, with peak-to-trough heights of up to about 1.5 nm. FIG. 4B illustrates a transmission electron microscope (TEM) image showing contrast variations due to thickness variations from the larger crystals that are about 2 nm in each dimension with extremely thin boundaries between crystals.

After fabrication of the metal film onto the sacrificial support layer, the sacrificial layer is substantially removed by dissolution using one or more solvents. A solvent that is suitable for dissolving the solid film is contacted with the sacrificial layer in a quantity and for a period of time sufficient to substantially dissolve the solid film. The choice of solvent or solvents will depend on the solubility of the solid film. Removal of the solid film leaves the unsupported metal film on the substrate.

Figure 5A:
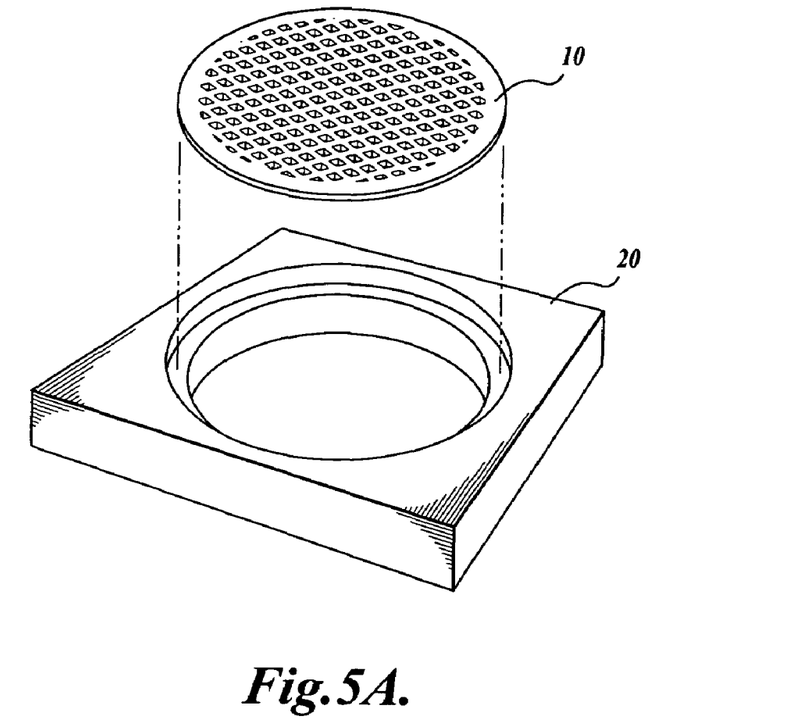
FIGS. 5A-5F provide a schematic illustration of a representative method of the invention for making an unsupported metal film.
Figure 5B:
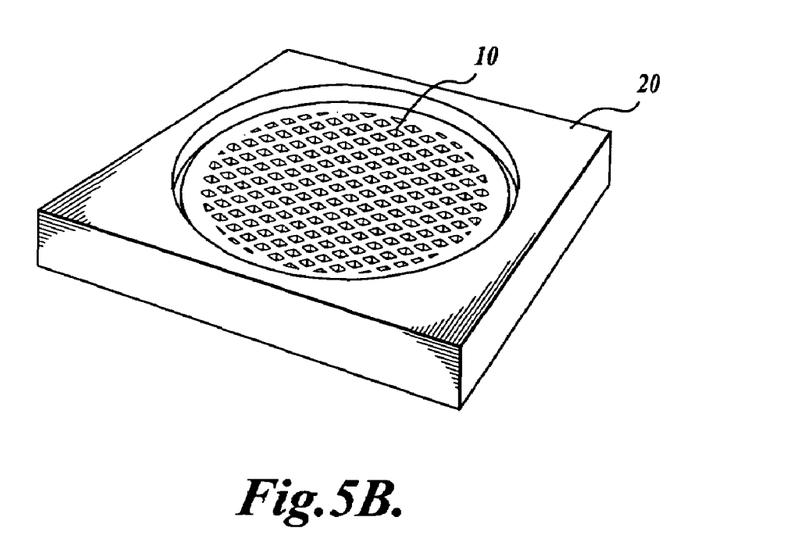
Figure 5C:
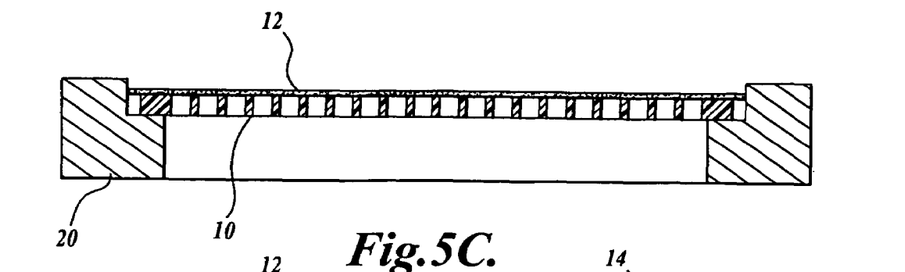
Figure 5D:
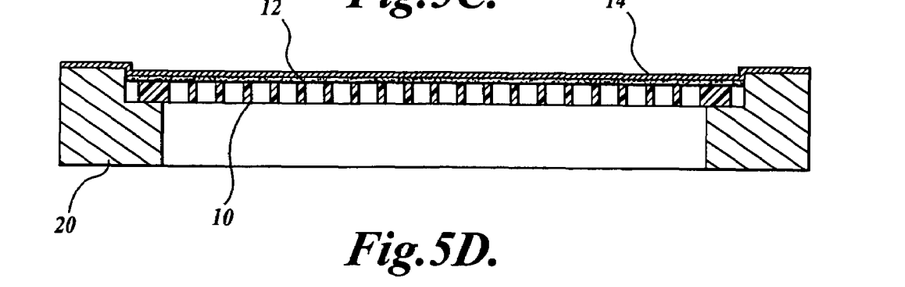
Figure 5E:
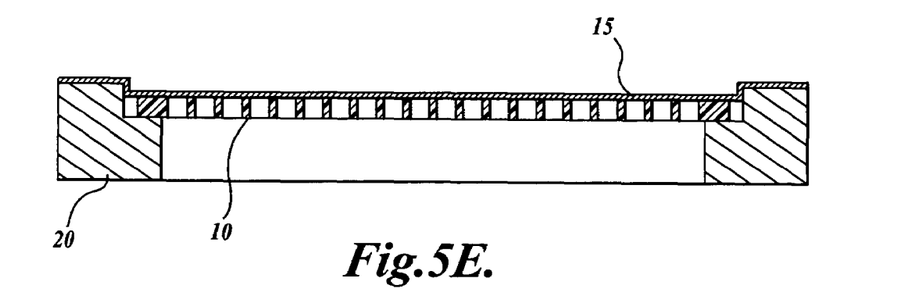
Figure 5F:
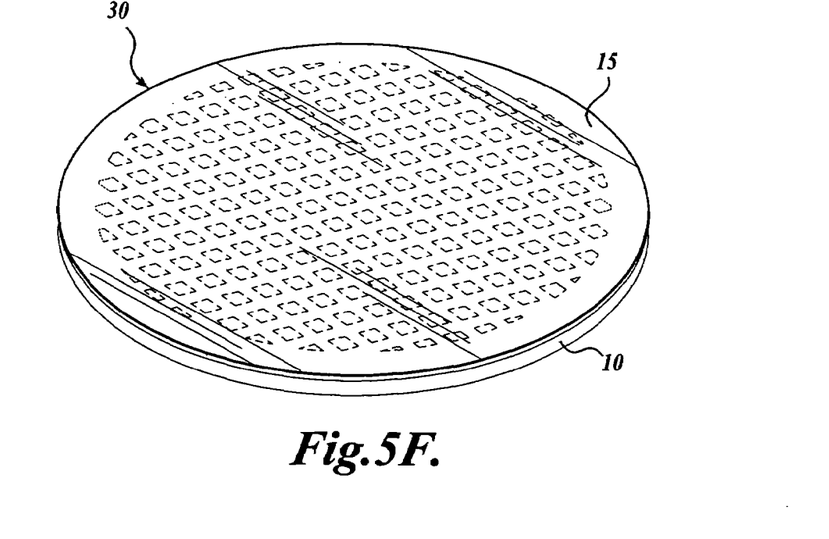
Figure 6:
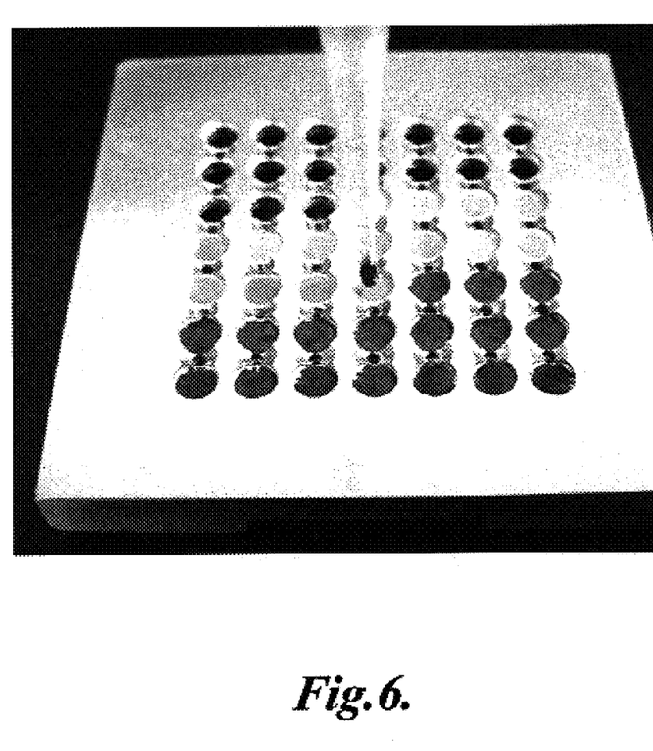
FIG. 6 is an image of a representative grid holder useful in a method of the invention for making metal films.

A method for making a representative unsupported metal film using a TEM grid (i.e., a representative substrate having a plurality of apertures) and holder is illustrated schematically in FIGS. 5A-5F. Referring to FIG. 5A, exemplary grid holder 20 is fitted with TEM grid 10 having a plurality of apertures (illustrated without reference numerals) to provide the assembly illustrated in FIG. 5B. FIGS. 5C-5E are cross-sectional views of the grid and holder illustrating the metal film making process. Referring to FIG. 5C, sacrificial support layer 12 is formed on grid 10 by applying a suitable solid in solution or suspension to the grid positioned in holder 20, and then allowing the film to form by drying; the film spans the grid windows (i.e., substrate's plurality of apertures). Metal film 14 is then fabricated on sacrificial support layer 12 by depositing metal onto the sacrificial layer (and grid holder). FIG. 5D illustrates metal film 14 on sacrificial support layer 12 spanning the windows of grid 10 in holder 20. The grid holder with metal film-coated sacrificial support layer is then treated with an appropriate solvent or solvents for dissolving and substantially removing the sacrificial support layer leaving an unsupported metal film suspended over the grid including the grid's windows and other surfaces. FIG. 5E illustrates unsupported metal film 15 spanning the windows of grid 10 in holder 20. The unsupported metal film and associated substrate is then removed from the grid holder to provide an integrally formed combination of an unsupported metal film and substrate. FIG. 5F illustrates integrally formed combination 30 including unsupported metal film 15 and associated substrate 10 having a plurality of apertures (illustrated in phantom in FIG. 5F). Referring to FIG. 5F, the unsupported metal film substantially completely overlays the perimeter of a major surface of the grid. It will be appreciated that the method described in reference to FIGS. 5A-5F can be carried out using a grid holder that can receive a multiplicity of grids, such as illustrated in FIG. 6.

In one embodiment, the invention provides a method for making unsupported metal films in high volume. In the method unsupported metal film grids are made in parallel.

In the method, an arrangement of blank TEM specimen grids are placed onto a platter containing channels for solvent access through the windows in the specimen grids. A sacrificial support layer is formed over the arrangement of grids to provide a film that bridges the windows of each of the TEM grids. The platter is then placed in a deposition chamber for the desired material for coating to provide a sacrificial layer coated with a metal film. After deposition, the platter is placed in a suitable container to which solvent is added to remove the sacrificial layer by dissolution. Solvent treatment can be repeated numerous times with fresh solvent for more extensive cleaning of the metal film. The platter is then allowed to air dry, leaving an array of TEM grids bearing unsupported metal films.

In this embodiment, a TEM grid holder is used for making a plurality of unsupported metal films in parallel. The grid holder receives a plurality of TEM grids such that a surface of each grid can be treated with a suitable solid in solution or suspension to form a solid film on the grids' surfaces and further subjected to a directed metal source for metal deposition. In one embodiment, the grid holder has "open" channels such that the sacrificial support layer film can be substantially removed by dissolution. The grid holder has dimensions that permit the holder to be placed within a deposition chamber and have compartments for receiving and holding the greatest number of TEM grids practicable. In one embodiment, the grid holder includes notches in connection with each compartment for an automated grid loading and an extraction mechanism for increased throughput manufacturing. In this embodiment, the notches are recesses such that individual grids may be loaded and removed by the aid of a pair of tweezers (See FIG. 6). Alternatively, simple grid holders can be used in which grid bearing unsupported metal films are floated on the surface of water and collected onto a mesh.

A grid holder having a plurality of compartments for receiving TEM grids is illustrated in FIG. 6. Referring to FIG. 6, the representative grid holder includes 49 compartments for receiving TEM grids. FIG. 6 shows a grid holder with 32 positions containing grids that are being loaded with permanent marker ink by pipette for forming the sacrificial support layer. The windows in these TEM grids (about 50 microns) are too small to be seen from this image.

Once the sacrificial support layer is formed and the metal film fabricated on the sacrificial support layer and grid holder, a solvent or solvents are added to a container in which the grid holder is placed. The solvent first contacts the underside of the grids, and additional solvent can be added until the grids are completely submerged to prevent exposing the metal films to the solvent/air interface, which has been found to damage the metal films. The solvent may be changed out one or more times for thorough removal of the sacrificial layer. In a mass production, recirculating solvent systems for continuous removal, and optional solvent recycling, can be used. After dissolution of the sacrificial support layer, the product grids are then allowed to air dry, after which they are ready for packaging and shipping, or further processing.

The metal films of the invention produced as described above can be further processed. In one embodiment, the metal films are further processed while contained in the grid holder.

In one embodiment, the metal films subjected to an oxygen plasma that is effective in burning off organic residues. Metal films so treated have significantly reduced residual carbon contamination for EDX and EELS spectroscopic analysis.

In one embodiment, the metal films can be further processed by chemical etching. In one embodiment, metal films are etched in concentrated acidic potassium cyanide. Chemical etching can reduce the background structure of the metal film to the point that it appears completely amorphous under high-resolution imaging conditions.

Etching can carried out by placing a test specimen on a drop of the cyanide solution (e.g., a silver cyanide plating bath commercially available from Technic Inc., Providence, R.I.) for a predetermined time in advance of treating the grids. The test specimen is monitored under an optical microscope until such time that the metal film suspended across the imaging windows begins to burst. That time is the predetermined time at which the grids are removed from the cyanide solution to a clean water solution.

Metal films of the invention and the methods for preparing these metal films are useful in a variety of applications.

As noted discussed above, the metal films of the invention can be used as support films in electron and scanned-probe microscopies. For use in electron microscopy, the metal film is conductive, electron transparent, strong, durable, radiation resistant, and capable of supporting a variety of samples including nanoparticles; nanowires; complex structures of metallic, ceramic, and semiconductor origin; biological tissues; organisms such as bacteria, viruses, and cells; macromolecules such as DNA, proteins, and polysaccharides; and polymeric and non-crystalline materials and structures. Functionalization through chemical and physical means of the metal films allows these films to be used in nanotechnology and nanobiotechnology. In addition to TEM, similar films can be used for scanning probe microscopy, such as atomic force microscopy and scanning tunneling microscopy, and scanning electron microscopy. The metal films of the invention can be used as a universal support for several microscopies.

The metal film can also be used for in situ x-ray photoelectron spectroscopy (XPS) measurements of adsorbed molecules on relevant surfaces, where the metal film is sufficiently thin that photoelectrons can be detected from the backside of the substrate when vacuum is applied.

In surface plasmon resonance spectroscopy (SPR), a continuous thin film of a conducting material is used as a substrate for the detection of a signal produced through adsorption of molecules to the substrate. The material of interest for adsorption may not necessarily produce a strong SPR signal unless the material is deposited onto a strong SPR signal producer, such as gold or silver. The surface for adsorption must be extremely thin or the SPR signal from the gold or silver is lost, and such films are nearly impossible to produce as a continuous film onto an existing gold or silver surface. The method of the invention can be used to create films for adsorption studies.

The metal films of the invention can be used in advanced light optic lenses. Traditional glass lenses absorb strongly at short wavelengths. Metal films coated onto glass lenses can prevent absorbance. In such an application, the metal film is sufficiently thin to prevent reflection and sufficiently uniform to prevent localized phase shifts. In precision laser beam splitters where the thinness of the beam splitter is crucial to prevent multiple laser reflections at the front and back surfaces of the splitter, the transmission and reflection properties of the beam splitter can be tuned by the composition and thickness of a metal film deposited on the splitter.

The metal films of the invention can be used in electron and x-ray beam apertures, where metal films are used to conduct away excess primary electrons and secondary electrons from x-rays. In this application, the metal film is opaque, yet thin to minimize the pathlength over which the electrons interact with the aperture.

The present invention provides unsupported, electron transparent metal films and methods for high volume production of these metal films for electron-based microanalysis technologies. The method of the invention is a high throughput, scaleable process that requires little human intervention and no special skill.

While the preferred embodiment of the invention has been illustrated and described, it will be appreciated that various changes can be made therein without departing from the spirit and scope of the invention.

The embodiments of the invention on which an exclusive property or privilege is claimed are defined as follows:

1. A method for making an unsupported film, comprising:
   (a) forming a solid layer on a surface of a substrate having a plurality of apertures, wherein the layer spans the surface's plurality of apertures;
   (b) fabricating a film on the solid layer; and
   (c) substantially completely dissolving the solid layer with a solvent to provide an unsupported film on the surface of the substrate.

2. The method of claim 1, wherein the film is a metal film.

3. The method of claim 2, wherein fabricating the metal film comprises sputtering metal onto the solid layer.

4. The method of claim 2, wherein the metal film comprises at least one of gold, silver, copper, nickel, palladium, platinum, iridium, rhenium, ruthenium, osmium, rhodium, their alloys, or their oxides.

5. The method of claim 1, wherein the solid layer is organic.

6. The method of claim 1, wherein the solid layer comprises at least one of varnish or ink.

7. The method of claim 1, wherein the solvent is at least one of acetone, methanol, or ethanol.

8. The method of claim 1, wherein the film substantially completely overlays the substrate's surface.

9. The method of claim 1, wherein the film overlaying the substrate's surface and the substrate's surface have substantially the same perimeter.

10. The method of claim 1, wherein the film has a thickness of from about 1 nm to about 3 nm.

11. The method of claim 1, wherein the film is a non-metal film.

12. The method of claim 11, wherein the non-metal film comprises at least one of carbon, silica, or alumina.

13. A method for making a specimen grid for transmission electron microscopy coated with an unsupported film, comprising:
   (a) forming a solid layer on a surface of a specimen grid, the grid having a plurality of windows, and wherein the layer spans the grid's windows;
   (b) fabricating a film on the solid layer; and
   (c) substantially completely dissolving the solid layer with a solvent to provide an unsupported film on the surface of the grid.

14. The method of claim 13, wherein the film is a metal film.

15. The method of claim 14, wherein the metal film comprises at least one of gold, silver, copper, nickel, palladium, platinum, iridium, rhenium, ruthenium, osmium, or rhodium, and their alloys and oxides.

16. The method of claim 13, wherein the film is a non-metal film.

17. The method of claim 16, wherein the non-metal film comprises at least one of carbon, silica, or alumina.

18. The method of claim 13, wherein the solid layer is organic.

19. The method of claim 13, wherein the solvent is at least one of acetone, methanol, or ethanol.

20. The method of claim 13, wherein the metal film substantially completely overlays the grid's surface.

21. The method of claim 13, wherein the film has a thickness of from about 1 nm to about 3 nm.

22. An integrally formed combination of an unsupported film and a substrate, comprising an unsupported film substantially completely overlaying a surface of the substrate having a plurality of apertures.

23. The combination of claim 22, wherein the film is a metal film.

24. The combination of claim 23, wherein the metal film comprises at least one of gold, silver, copper, nickel, palladium, platinum, iridium, rhenium, ruthenium, osmium, or rhodium, and their alloys and oxides.

25. The combination of claim 22, wherein the film is a non-metal film.

26. The combination of claim 25, wherein the non-metal film comprises at least one of carbon, silica, or alumina.

27. The combination of claim 22, wherein the film has a thickness of from about 1 nm to about 3 nm.

28. The combination of claim 22, wherein the substrate having a plurality of apertures is a specimen grid for transmission electron microscopy.

29. An integrally formed combination of an unsupported film and a substrate, comprising an unsupported film substantially completely overlaying a surface of the substrate having a plurality of apertures, the combination made by the steps of:
(a) forming a solid layer on a surface of a substrate having a plurality of apertures, wherein the layer spans the surface's plurality of apertures;
(b) fabricating a film on the solid layer; and
(c) substantially completely dissolving the solid layer with a solvent to provide an unsupported film on the surface of the substrate.

30. The combination of claim 29, wherein the film is a metal film.

31. The combination of claim 30, wherein the metal film comprises at least one of gold, silver, copper, nickel, palladium, platinum, iridium, rhenium, ruthenium, osmium, or rhodium, and their alloys and oxides.

32. The combination of claim 29, wherein the film is a non-metal film.

33. The combination of claim 32, wherein the non-metal film comprises at least one of carbon, silica, or alumina.

34. The combination of claim 30, wherein fabricating the metal film comprises sputtering metal onto the solid layer.

35. The combination of claim 29, wherein the solid layer is organic.

36. The combination of claim 29, wherein the film substantially completely overlays the substrate's surface.

37. The combination of claim 29, wherein the film has a thickness of from about 1 nm to about 3 nm.

* * * * *